United States Patent [19]

Li et al.

[11] 4,158,811

[45] Jun. 19, 1979

[54] METHOD AND APPARATUS FOR TESTING AND SETTING MAGNETIC FIELD STRENGTH OF PERMANENT MAGNETS IN MAGNETIC BUBBLE DOMAIN MODULES

[75] Inventors: Hsiao-Yuan Li, Dallas; Rex A. Naden, Richardson; Alvis D. Stephenson, Jr.; Gene D. Lee, both of Dallas, all of Tex.

[73] Assignee: Texas Instruments Incorporated, Dallas, Tex.

[21] Appl. No.: 810,148

[22] Filed: Jun. 27, 1977

[51] Int. Cl.² ............................................. G01R 33/12
[52] U.S. Cl. ........................................ 324/210; 365/1; 365/2
[58] Field of Search .................... 324/210, 205; 365/1, 365/2; 29/574, 588, 593, 604; 361/143, 147

[56] References Cited

U.S. PATENT DOCUMENTS

| | | | |
|---|---|---|---|
| 3,836,896 | 9/1974 | Rifkin | 365/1 |
| 3,864,671 | 2/1975 | Myer | 365/1 |
| 3,931,618 | 1/1976 | Lacey | 365/1 |

Primary Examiner—Robert J. Corcoran
Attorney, Agent, or Firm—Melvin Sharp; Richard L. Donaldson; William E. Hiller

[57] ABSTRACT

Method and apparatus for testing and setting the field strength of permanent magnets in a magnetic bubble domain chip module, wherein the final molded module is formed to contain a pair of longitudinal slots which run through the module on opposite sides thereof. The module is inserted, via said slots, onto conducting members of a magnetic bubble module testing apparatus. The conducting members effectively provide one turn coils on each side of the module. Current is induced in these coils in such a way as to either add to or subtract from the bias field provided for the magnetic bubble domain chip by the permanent magnets of the module. The module is tested to determine the upper and lower operating levels of the bias field for effective operation of the chip, and the device is remagnetized to set the bias field of the module in the center, or optimal point, of the bias margin.

15 Claims, 6 Drawing Figures

METHOD AND APPARATUS FOR TESTING AND SETTING MAGNETIC FIELD STRENGTH OF PERMANENT MAGNETS IN MAGNETIC BUBBLE DOMAIN MODULES

BACKGROUND OF THE INVENTION

This invention relates to the testing of magnetic bubble domain chip modules, and, in particular, to a method and apparatus for testing and setting the magnetic field strength of the permanent magnets in a completed magnetic bubble module so as to adjust its bias field to a precise level during the final manufacturing process.

Magnetic bubble devices require a magnetic field, usually called the bias field, perpendicular to the plane of the active surface of the chip. This field forms the magnetic bubbles on the substrate, controls the size of the bubbles, and keeps them in a non-volatile state. The strength of the bias field is critical, and slight deviations in this field strength from the optimal value strongly affect the operation of the chip. This bias field may be supplied by a structure employing permanent magnets and metal alloy plates for improving the uniformity of the magnetic field across the surface of the chip. Since a precise magnetic field is required, and the strength of this field could be adversely affected by stray magnetic fields in the environment in which the chip is to be operated, the magnetic bubble domain module is typically provided with an enclosure consisting of a magnetic shielding material which shunts these stray fields. The magnetic bubble chip, appendant assemblies, and magnetic bias field structure are then encapsulated with an insulating material which fills the enclosure of shielding material. It is thus quite difficult to precisely reset or adjust the bias field after the enclosure of shielding material has been incorporated into the module and the encapsulating insulating material has been introduced in the enclosure without resorting to disassembly.

Small deviations which occur during fabrication and assembly of the magnetic bubble domain chips and devices causes each device to require a slightly different bias field strength. One method of supplying the bias field involves testing the magnetic bubble domain chip separately, testing the bias field structure separately, and matching the magnetic bubble domain chip and bias field structure before the final manufacturing process in which the two are joined. By way of illustration, using this method, a magnetic bubble domain chip which operates best at a 108 Oe. is placed in a bin with other 108 Oe. chips, and a bias field structure magnetized to 108 Oe. is placed in a bin with other 108 Oe. bias field structures. The elements in the bins are matched and sent into the final manufacturing process in which the module is completed. One problem with this method is its inaccuracy, since the final packaging steps will produce deviations which will affect the precise relationship between the bias field and the chip supposedly insured by the matching process. It is also expensive and time consuming, and does not readily lend itself to assembly line volume production procedures.

Substrate impurities and minor deviations in fabrication procedures commonly occurring in the production of magnetic bubble domain chips may cause portions of the chip to be non-functional. Because the number of non-functional areas of the chips is a function of the bias field strength, a non-optimal bias field will result in even more defective areas on the chip. It would thus be desirable to set the bias field at such a value during the manufacturing process so as to minimize the number of non-functional areas on the chip.

BRIEF SUMMARY OF THE INVENTION

Briefly, the testing method for this invention utilizes a magnetic bubble domain module fabricated to include a pair of longitudinal slots extending through the module on opposite sides thereof. A testing apparatus interfaces the signal leads of the magnetic bubble domain device with a computer programmed to test the operation of the device. The testing apparatus includes conducting members which may be inserted through the magnetic bubble domain module via the longitudinal slots therein and which are then energized by a current source which may selectively provide a constant electrical current at any one of a number of magnitudes of constant current in order to vary the magnitude of the magnetic bias field of the device. The testing procedure consists of energizing the conducting members in such a way so as to vary the magnitude of the magnetic bias field of the module by predetermined increments above and below its nominal premagnetized level. Using this procedure, it is possible to determine the optimal bias field magnitude relative to the particular magnetic bubble domain device. The module may then be remagnetized to this optimal magnitude without disassembly, and a second test performed in order to provide a map indicating the non-functional areas of the magnetic bubble domain chip relative to the optimal bias field magnitude, this map being provided to the consumer along with the other specifications for the device. The magnetic bubble domain module design and testing apparatus allow adjustments of the bias field strength without interfering with the integrity of the module itself, while the testing procedure may be easily incorporated into a mass production operation and results in a more efficient magnetic bubble domain device.

DETAILED DESCRIPTION OF THE DRAWINGS

Figure 1:
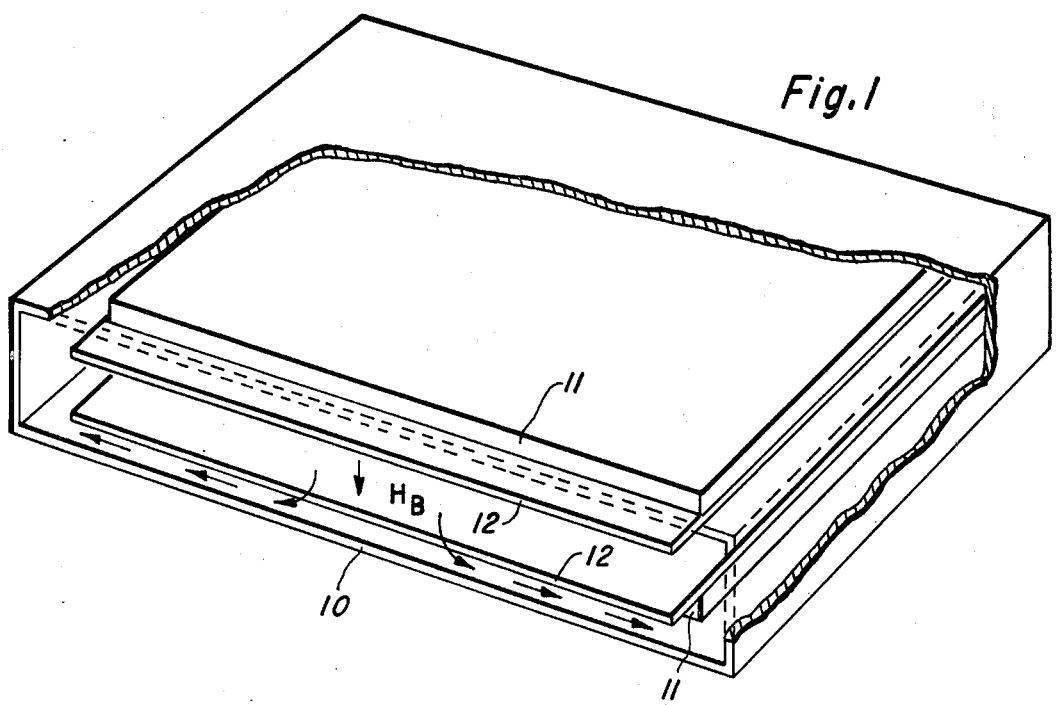
FIG. 1 is a perspective view of a housing for a magnetic bubble domain chip and including a permanent magnet structure used to produce the perpendicular magnetic bias field for the chip.

Referring more specifically to the drawings, FIG. 1 shows an open-ended tubular housing 10, which has a substantially rectangular cross-section. The housing 10 is intended to be employed as the outer casing for a magnetic bubble domain device and is constructed of a suitable magnetic shielding material, such as an alloy of 78 percent nickel, 22 percent iron, for example. Thus, the housing 10 is used both to provide the external package for the device and to shield the magnetic bubble domain chip from stray magnetic fields present in the operating environment. The housing 10 thereby insures that a predetermined magnetic environment is maintained inside the completed module. A permanent magnet structure is mounted within the housing 10 to provide an appropriate bias field for the magnetic bubble domain chip. To this end, a pair of substantially rectangular plates 11, 11 constructed of a permanent magnet material, such as Indox for example, are secured, via major surfaces thereof, inside the housing 10 to top and bottom major planar surfaces thereof, so that the plates 11, 11 are parallel and in general registry with each other. Plates 11, 11 may be secured to the housing 10 using epoxy or any other suitable adhesive. The permanent magnet structure further includes respective substantially rectangular spreader plates 12, 12, constructed of a suitable soft magnetic material, silicon steel for example, which are secured, using epoxy or any other suitable adhesive, to each permanent magnet plate 11 so that major planar surfaces of plates 11, 11 and 12, 12 are disposed against each other in contiguous relationship. The spreader plates 12, 12 are dimensionally larger than the permanent magnet plates 11, 11 and thus entirely cover the major surfaces of the plates 11, 11. The spreader plates 12, 12 improve the uniformity of the magnetic field produced by the permanent magnet plates 11, 11 in that the soft magnetic material thereof spreads the flux lines of the permanent magnets 11, 11 over a larger area, thus evening out the irregularities in the flux patterns of the field. The housing 10, the permanent magnet plates 11, 11 and the spreader plates 12, 12 cooperate to produce a magnetic bias field $H_B$, the flux paths of which are indicated in FIG. 1 by the directional arrows.

Figure 2:
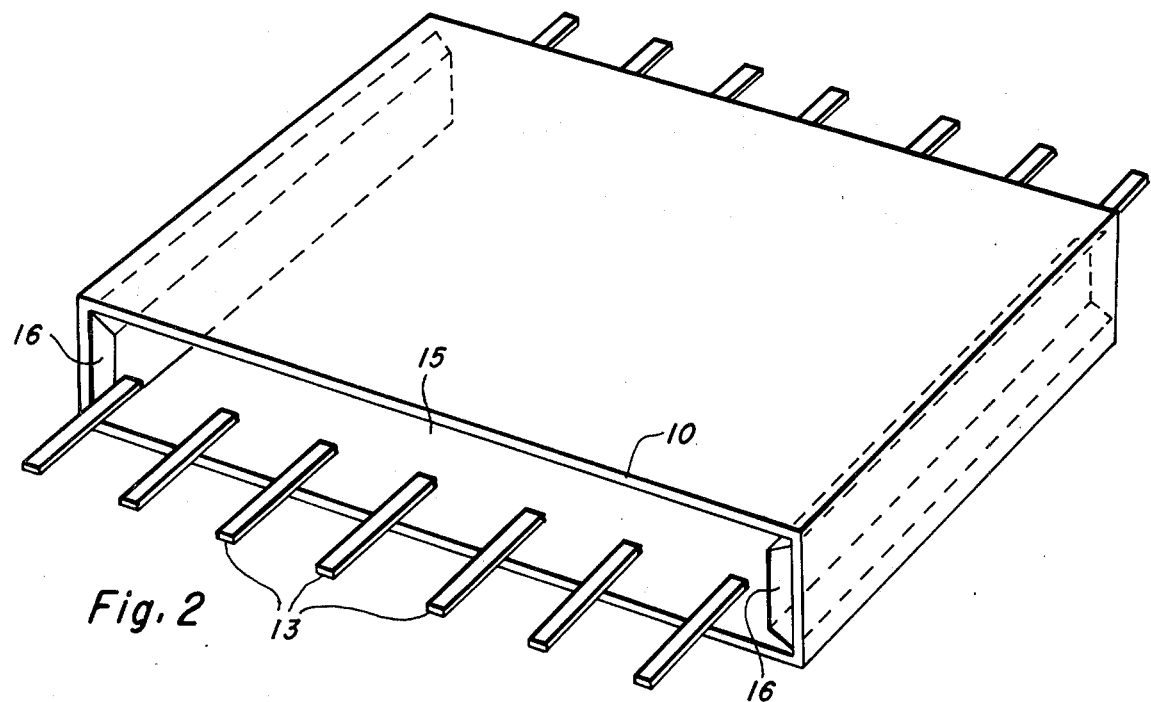
FIG. 2 is a perspective view of the completed magnetic bubble domain module utilizing the housing and permanent magnet structure of FIG. 1.

A completed magnetic bubble domain module incorporating the housing 10 and the permanent magnet structure of FIG. 1 is shown in FIG. 2. In this connection, a magnetic bubble domain chip substructure, which includes one or more magnetic bubble domain chips, the coils for producing the rotating magnetic field necessary to propagate the bubbles on the chips, and external signal leads 13 for the chips, is inserted through one of the open ends of the housing 10 between the spreader plates 12, 12 such that the plane of the active surfaces of the chips is perpendicular to the magnetic bias field $H_B$ and the signal leads 13 extend from the open ends of the housing 10. The aforementioned substructure is then encapsulated in an insulating material by employing a suitable molding operation, wherein a body of moldable insulating material 15 which has a low expansion coefficient and a high glass transition temperature to insure dimensional stability and minimize stress is used to enclose the substructure. One such suitable molding material is the advanced Novalak epoxy described in U.S. Pat. No. 3,859,718. This molding operation is performed in such a way as to leave two longitudinal slots 16, 16 in the final package, with the signal leads 13 extending from the open ends of the housing 10 between the slots 16, 16. The slots 16, 16 extend lengthwise through the package along the sides thereof and are included to facilitate the testing procedure to be described in more detail hereinafter.

Figure 3:
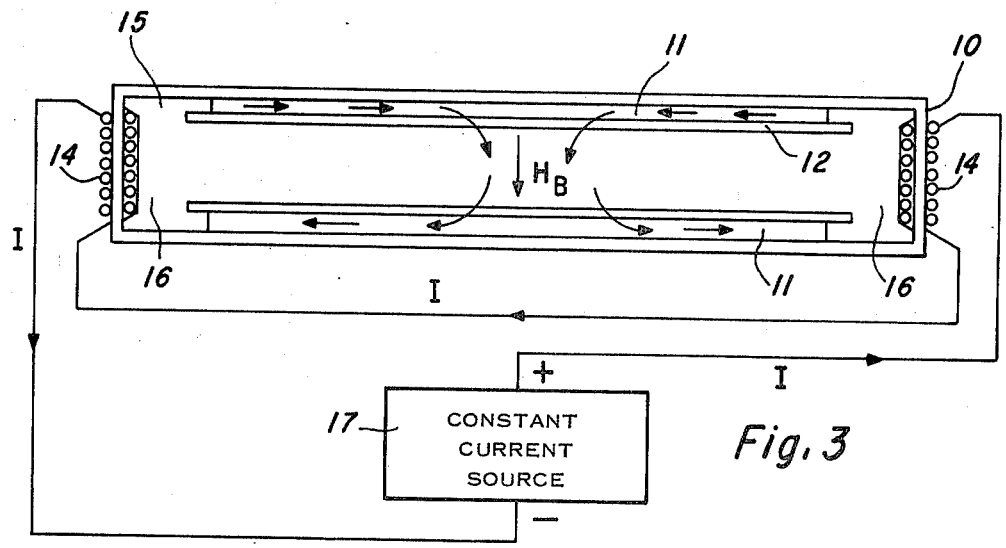
FIG. 3 is a diagrammatic view including a cross-sectional view of the completed magnetic bubble domain module of FIG. 2 and illustrating apparatus for varying the perpendicular magnetic bias field for the magnetic bubble domain device.

FIG. 3 illustrates an apparatus for testing and setting the field strength of the permanent magnets 11, 11 so as to vary the bias field for the completed module of FIG. 2 and obtain an optimal setting. The apparatus comprises a pair of coils 14, 14 connected to a current source 17. Current source 17 provides a constant electrical current at any one of a number of preselected magnitudes. The pair of coils 14 are formed by a plurality of turns of magnet wire wound through the slots 16, 16 in the package and about the opposite sides of the housing 10. The coils 14, 14 are connected to the constant current source 17 and to each other in such a way as to provide a single current loop through the coils. Energization of the coils 14, 14 by means of the constant current source 17 produces a magnetic field which either adds to or subtracts from the field produced by the permanent magnet plates 11, 11 depending on the direction and strength of the current I in the coils 14, 14.

Figure 4:
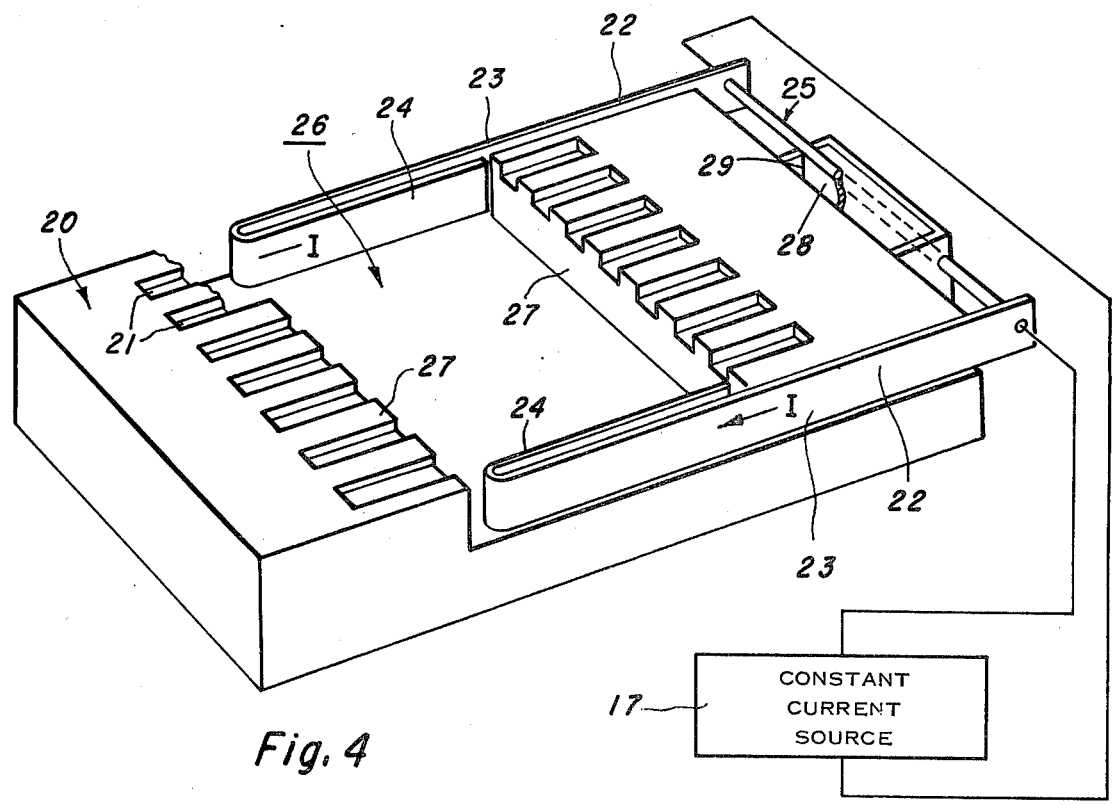
FIG. 4 is a perspective view of testing apparatus for varying the perpendicular magnetic bias field for the magnetic bubble domain device in accordance with the present invention.

FIG. 4 is a perspective view of a preferred embodiment of a testing apparatus in accordance with this invention. The testing apparatus comprises a block 20 of insulating material, such as a suitable plastic, nylon for example. The block 20 has a top surface provided with a central transverse channel or recess 26 so as to define a pair of lead-receiving raised portions 27, 27 at the respective ends of the block 20 on opposite sides of the transverse channel 26. Each of the raised portions 27, 27 of the block 20 is provided with a plurality of lead slots 21 formed on its surface. The lead slots 21 are narrow indentations which are parallel to each other and spaced from each other a distance corresponding to the distance between the signal leads 13 of the magnetic bubble domain module. The lead slots 21 are adapted to receive the signal leads 13 of the magnetic bubble domain module when the magnetic bubble domain module is placed within the central channel 26 of the block 20. The testing apparatus further includes a conductor bar assembly and a current source 17 to which the conductor bar assembly is electrically connected. The conductor bar assembly includes a pair of bar members 22, 22 in the form of flat strips of metal respectively folded upon themselves to define a J-shaped configuration comprising a long primary bar 23 and a short secondary bar 24. The primary bars 23, 23 are connected to an elevation apparatus 25, which, when brought to its lowest position, places the secondary bars 24, 24 parallel along the open ends of the channel 26 on opposite sides of the block 20. The elevation apparatus 25 is attached to block 20 and may be any suitable assembly which is adapted to raise and lower the conductor bar assembly, such as an elongated bar member 28 adapted to slide in and out of a slotted member 29 attached to block 20. The secondary bars 24, 24 fit into the slots 16, 16 of the magnetic bubble domain module and will perform the same function as the coils 14, 14 in FIG. 3, this function to be described in more detail hereinafter. The bar members 22, 22 may be formed of any suitable electrically conductive metal, such as copper for example, and are energized by the current source 17 which is electrically connected to the outer ends of the primary bars 23, 23.

Figure 5:
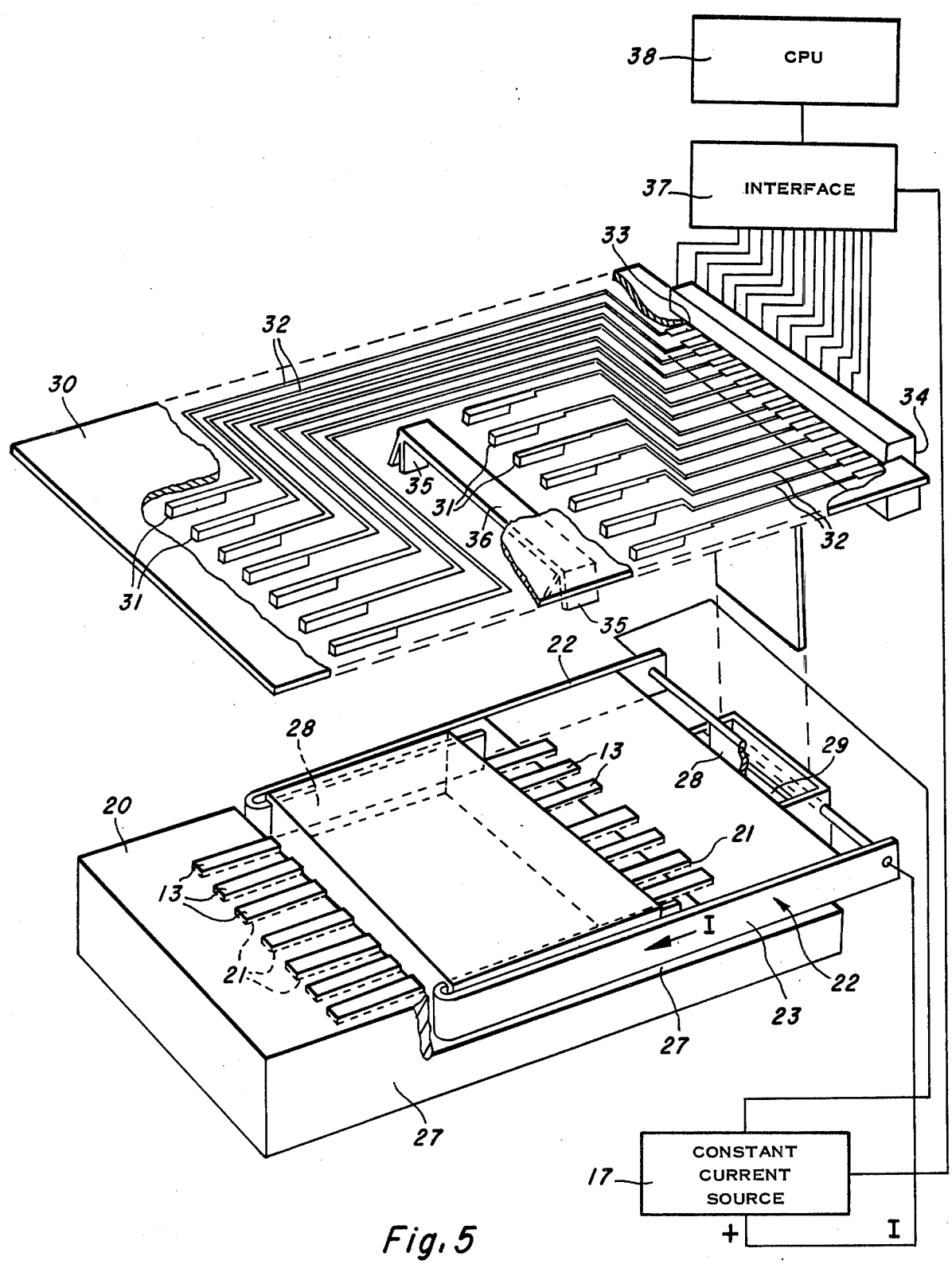
FIG. 5 is a perspective view of the testing apparatus of FIG. 4 showing the magnetic bubble domain module of FIG. 2 inserted therein, and used in the preferred embodiment of this invention including an assembly for gaining electrical access to the chip for analyzation of chip performance as the perpendicular magnetic bias field is varied.

Referring to FIG. 5, a magnetic bubble domain module is shown as being received by the central channel 26 in the block 20, the module being supported by its signal leads 13 which are disposed in the lead slots 21 formed in the block 20 and by the secondary bars 24, 24 of the bar members 22, 22 which are inserted into the slots 16, 16 of the module. An elongated rectangular printed circuit board 30 of insulating material is connected to a second elevation apparatus 34. Upon moving the apparatus 34 to its lowest position, the bottom face of the printed circuit board 30 is brought into contact with the tops of the raised portions 27, 27 of the blocks 20. The printed circuit board 30 is provided with a plurality of conducting tabs 31 on its bottom face, the tabs 31 extending from the surface thereof. The tabs 31 are arranged in two sets separated by a distance substantially equal to the width of the central channel 26 on the surface of the block 20. The individual conducting tabs 31 of each set are parallel to each other and spaced apart from each other a distance corresponding to the spacing between the lead slots 21 on the surface of the block 20. Thus, when the printed circuit board 30 is brought to its lowest position, the conducting tabs 31 fit into the lead slots 21 and contact the signal leads 13. A plurality of narrow line conductors 32 are also disposed on the bottom surface of the printed circuit board 30. The conductors 32 contact the conducting tabs 31 and are disposed on the bottom surface of the printed circuit board 30 so as to electrically connect the conducting tabs 31 with an elongated edge connector 33 disposed along one edge of the board 30. The edge connector 33 is in turn electrically connected to an interface device 37, and the interface device 37 is electrically connected to a suitable computer 38 so that signals to and from the magnetic bubble domain chip in the module may be monitored and analyzed during the testing procedure. Finally, the printed circuit board 30 has disposed on its bottom face a pair of spaced apart bifurcated prong members 35, 35 of conductive material which extend from the bottom face of the circuit board 30. The prong members 35, 35 are electrically connected to each other by a transverse elongated conductor 36 disposed on the bottom surface of the printed circuit board 30. The prong members 35, 35 contact the ends of the secondary bars 24, 24 when the circuit board 30 is brought to its lowest position, so that the transverse conductor 36 connects the two bar members 22, 22 to form a single current path through the magnetic bubble domain module being tested. The electrical current is supplied by the current source 17 which may be programmable to provide a constant current of a preselected magnitude. The conducting tabs 31, the conductors 32, prong members 35, 35 and the transverse conductor 36 may be made of any suitable conducting metal, such as copper, for example, and may be disposed on the bottom face of the printed circuit board 30 by using any suitable technique employed in the production and fabrication of printed circuit boards.

The testing procedure in accordance with the present invention is initiated by mounting a magnetic bubble domain module of the type shown in FIG. 2, on a testing apparatus in the manner shown in FIG. 5. The bar members 22, 22 of the testing apparatus are raised so that the magnetic bubble domain module having the longitudinal slots 16, 16 along the sides thereof, may be received by the central channel 26 of the insulating block 20 with the secondary bars 24, 24 of the bar members 22, 22 inserted within the slots 16, 16 of the module.

The bar members 22, 22 are brought to their lowest position so that the signal leads 13 of the package reside in the lead slots 21 of the block 20, and the body of the magnetic bubble domain module is disposed in the central channel 26 of the top surface of the block 20. The printed circuit board 30 is then brought to its lowest position, wherein the conducting tabs 31 are received in the lead slots 21 in electrical contact with the signal leads 13. The prong members 35, 35 contact the ends of the secondary bars 24, 24 to complete the current path through the magnetic bubble domain module by means of the transverse conductor 36 connected between prong members 35, 35. The current source 17 is actuated to produce the current through the bar members 22, 22, with the secondary bars 24, 24 thereof acting effectively as one-turn coils on either side of the magnetic bubble domain module. The current source 17 is actuated and controlled by the interface device 37 and the computer 38 to produce a constant current which may be stepped up or down in increments in order to vary the bias field of the device. These current increments may be controlled by a program run on the computer 38, although it should be understood that any suitable means of regulating the current developed from the current source 17 may be employed. The current source 17 enables variations in the resistance of the bar members, which could interfere with the ability of the testing apparatus to provide non-varying bias field increments, to be substantially eliminated. As is well known in the art, a magnetic bubble domain device requires a rotary magnetic field in the planar surface of the magnetic bubble domain chip of the device which drives the magnetic bubbles along the propagation paths thereof. This field may be produced by energizing a pair of coils wound around the chip and in orthogonal relationship to each other. In the testing procedure herein disclosed, the energization of the coils through which the in-plane rotary magnetic field is developed is provided through four of the signal leads 13 while the bias field is varied by adjusting the constant current magnitude supplied by the current source 17.

Figure 6:
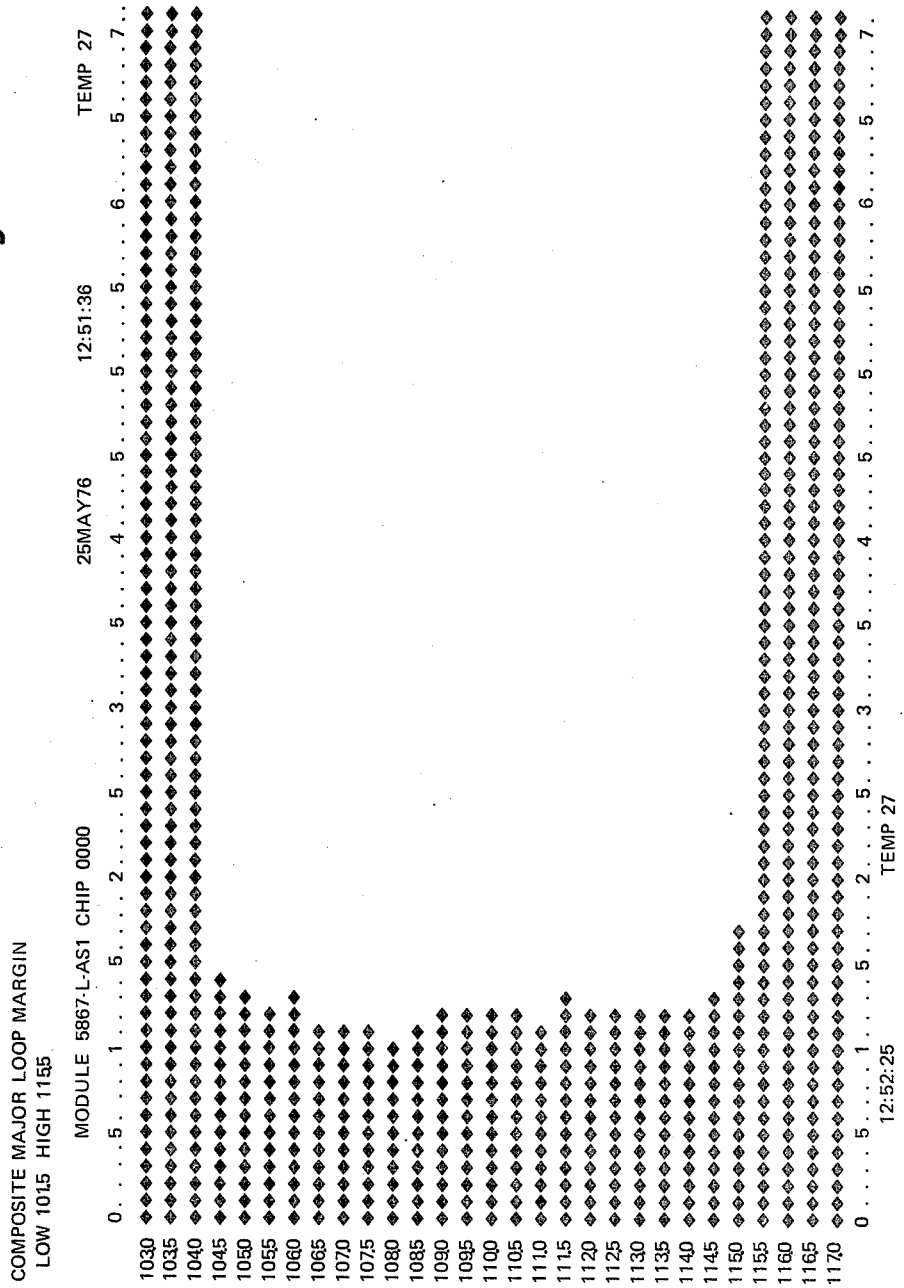
FIG. 6 is a pictorial representation of the bias margin analysis of a magnetic bubble domain chip produced by a testing procedure employing the apparatus and assembly of FIG. 5.

FIG. 6 illustrates a graph-like map or printout of test results produced by the computer 38 in the testing of a magnetic bubble domain device in accordance with this invention. The magnetic bubble domain device is a single chip memory device having a major/minor loop configuration, such as that described in U.S. Pat. No. 3,618,054, for example. As may be seen by FIG. 6, the computer program utilized in this example prints a plurality of diamond-shaped characters along the horizontal axis of the graph, each of said characters representing either a single nonfunctional loop of the magnetic bubble domain chip being tested, or a group of said loops. The program also prints the bias field strength in Oe. units along the vertical axis. It is seen from FIG. 6 that, as the bias field is increased, the number of non-functioning loops remains large until the first bias field strength value at which the chip is operable, at which point there is a substantial reduction in the number of diamond shaped characters printed along the horizontal axis. In this case the first value at which the chip operated was 104.5 Oe. The computer maps the number of non-functioning loops as the bias field is increased and, as can be seen from FIG. 6, in this example the chip ceased operating at a value of 115.5 Oe, as is represented by the substantial increase in the number of diamond-shaped characters printed along the horizontal axis. The optimal, or center, operating bias field strength for the particular device of this example is approximately 110 Oe. After the optimal operating bias field strength is discovered using the method described, the device may be remagnetized to the optimal point by saturating the housing 10 with a magnetizer/demagnetizer apparatus, thus remagnetizing plates 11, 11 to the desired level. However, FIG. 6 indicates that, even at the optimal operating strength of the bias field, a number of minor loops may be defective and thereby rendered non-functional. Since defective minor loops are unsuitable for storing information data, their presence and location on a given magnetic bubble domain chip must be catalogued and made readily known if the chip is to be used effectively. To this end, a redundancy map may be produced by the computer 38. The redundancy map identifies the defective minor loops, thereby permitting an operator to utilize only the operable minor loops of the chip for data storage.

Thus, the testing procedure described enables the field strength of the permanent magnets in the magnetic bubble domain module to be set so that the chip is operated at the optimal value of the bias field and further enables the defective minor loops of the chip to be identified. The testing procedure is highly efficient and inexpensive and is readily incorporated into a typical manufacturing process for producing magnetic bubble domain devices in the last stages thereof without requiring disassembly of the module. This insures that the operation of the magnetic bubble domain device is not affected by manufacturing steps occurring after testing. In addition, since temperature variations in the external operating environment affect the operation of the magnetic bubble domain device, this method may be used to set the value of the bias field strength relative to the ambient temperature to insure effective operation of the device within contemplated temperature specifications.

What is claimed is:

1. Apparatus for establishing the magnetic bias field strength within an optimum range of the permanent magnet structure for a shielded magnetic bubble domain module having a pair of elongated slots extending through the module on opposite sides thereof, said apparatus comprising:
    magnetic field generating means operably associated with said magnetic bubble domain module but separate therefrom and including conducting members adapted to be temporarily moveably inserted within the magnetic bubble domain module through the slots therein and oriented with respect thereto to vary the magnetic bias field of the magnetic bubble domain module;
    current source means electrically connected to said magnetic field generating means for selectively providing a constant electrical current at any one of a plurality of magnitudes of constant currents to the conducting members of said magnetic field generating means; and
    said magnetic field generating means providing a magnetic bias field within the magnetic bubble domain module at a selected field strength in response to energization of said conducting members thereof by a constant electrical current of a selected magnitude from said current source means.

2. Apparatus as set forth in claim 1, and further including analyzer means operably associated with said magnetic bubble domain module for testing said magnetic bubble domain module via evaluation and analyzation of said module during the establishment of an optimum magnetic bias field strength for the permanent magnet structure.

3. Apparatus as set forth in claim 2, further including:
    support means for supporting a magnetic bubble domain module during the testing, thereof and
    contact means operably associated with said support means and adapted to contact the signal leads of the magnetic bubble domain module for supplying electrical signals to and receiving electrical signals from the signal leads.

4. A magnetic bubble domain module comprising:
    a tubular housing of magnetic-shielding material,
    a permanent magnet structure mounted within said tubular housing,
    a molded body of insulating material substantially filling said housing,
    a magnetic bubble domain chip substructure including at least one magnetic bubble domain chip embedded in said insulating body, and
    said insulating body having first and second recesses extending along opposite sides thereof and cooperating with said housing to define elongated slots adapted to accept conducting members of an apparatus for performing tests on the magnetic bubble domain module temporarily moveably inserted within said slots during testing.

5. Apparatus for establishing the magnetic bias field strength within an optimum range of the permanent magnet structure for a shielded magnetic bubble domain module, said apparatus comprising:
    magnetic field generating means operably associated with said magnetic bubble domain module but separate therefrom and including conducting members adapted to be temporarily disposed along the opposite sides of the magnetic bubble domain module and oriented with respect thereto to vary the magnetic bias field of the magnetic bubble domain module;
    current source means electrically connected to said magnetic field generating means for selectively providing a constant electrical current at any one of a plurality of magnitudes of constant currents to the conducting members of said magnetic field generating means; and
    said magnetic field generating means providing a magnetic bias field within the magnetic bubble domain module at a selected field strength in response to energization of said conducting members thereof by a constant electrical current of a selected magnitude from said current source means.

6. A process for establishing the magnetic bias field strength of the permanent magnet structure for a magnetic bubble domain module within an optimum range, said process comprising the steps of:
    selectively providing a plurality of constant electrical currents at respective different magnitudes to a magnetic field generating means in operable association with the magnetic bubble domain module,
    generating a plurality of magnetic bias fields within the magnetic bubble domain module at selected different field strengths corresponding to the respective magnitudes of said plurality of constant electrical currents in response to the respective energizations of said magnetic field generating means by the plurality of constant electrical currents,
    determining the range of upper and lower magnetic field strengths from the plurality of generated magnetic bias fields of different field strengths between which said magnetic bubble domain module operates, and magnetizing the permanent magnet structure to set the magnetic bias field strength thereof at a magnitude lying in the range of magnetic field strengths as determined.

7. A process as set forth in claim 6, further including: connecting the signal leads of said magnetic bubble domain module to analyzer means, and receiving signals from said magnetic bubble domain module in response to energization thereof via said signal leads to test said magnetic bubble domain module during a simulated operation thereof controlled by said analyzer means.

8. A process as set forth in claim 6, further including establishing the optimal magnetic bias field strength of the permanent magnet structure for the magnetic bubble domain module within the range of magnetic field strengths as determined, and thereafter magnetizing the permanent magnet structure to set the magnetic bias field strength thereof at the optimal magnitude.

9. A process as set forth in claim 6, wherein the plurality of constant electrical currents are selectively provided to the magnetic field generating means by applying successive different magnitudes of constant current to said magnetic field generating means at a predetermined time interval.

10. A process as set forth in claim 6, wherein the magnetic bubble domain module has a pair of elongated slots extending through the module on opposite sides thereof, said process further including:

initially inserting conducting members of the magnetic field generating means within the slots in the magnetic bubble domain module wherein the conducting members are oriented with respect to the magnetic bubble domain module to vary the magnetic bias field thereof in response to energization of the conducting members, and thereafter selectively providing the plurality of constant electrical currents at respective different magnitudes to said conducting members in generating the plurality of magnetic bias fields within the magnetic bubble domain module at selected different field strengths.

11. Apparatus for establishing the magnetic bias field strength within an optimum range of the permanent magnet structure for a shielded magnetic bubble domain module having a pair of elongated slots extending through the module on opposite sides thereof, said apparatus comprising:

magnetic field generating means operably associated with said magnetic bubble domain module and including conducting members adapted to be inserted within the magnetic bubble domain module through the slots therein and oriented with respect thereto to vary the magnetic bias field of the magnetic bubble domain module; said conducting members comprising first and second bar members, each of said bar members being an elongated flat strip of metal folded upon itself to define a J-shaped configuration including a long primary bar and an inturned short secondary bar, and the inturned short secondary bars of said conducting members being adapted to be received within the slots of the magnetic bubble domain module;

current source means electrically connected to said magnetic field generating means for selectively providing a constant electrical current at any one of a plurality of magnitudes of constant currents to the conducting members of said magnetic field generating means; and said magnetic field generating means providing a magnetic bias field within the magnetic bubble domain module at a selected field strength in response to energization of said conducting members thereof by a constant electrical current of a selected magnitude from said current source means.

12. Apparatus for establishing the magnetic bias field strength within an optimum range of the permanent magnet structure for a shielded magnetic bubble domain module having a pair of elongated slots extending through the module on opposite sides thereof, said apparatus comprising:

magnetic field generating means operably associated with said magnetic bubble domain module but separate therefrom and including conducting members adapted to be temporarily moveably inserted within the magnetic bubble domain module through the slots therein and oriented with respect thereto to vary the magnetic bias field of the magnetic bubble domain module;

current source means electrically connected to said magnetic field generating means for selectively providing a constant electrical current at any one of a plurality of magnitudes of constant currents to the conducting members of said magnetic field generating means;

support means for supporting the magnetic bubble domain module during the testing thereof, said support means comprising a block of insulation material, said block having a surface provided with a transverse channel defining raised portions on opposite sides of said channel, each of said raised portions having a plurality of parallel lead slots therein extending to the respective edges of said channel, and said channel being adapted to receive the magnetic bubble domain module with the signal leads thereof received in said plurality of lead slots during the testing thereof;

contact means operably associated with said block and adapted to contact the signal leads of the magnetic bubble domain module for supplying electrical signals to and receiving electrical signals from the signal leads;

said magnetic field generating means providing a magnetic bias field within the magnetic bubble domain module at a selected field strength in response to energization of said conducting members thereof by a constant electrical current of a selected magnitude from said current source means; and analyzer means operably associated with said magnetic bubble domain module and electrically connected to said contact means for testing said magnetic bubble domain module via evaluation and analyzation of said module during the establishment of an optimum magnetic bias field strength for the permanent magnet structure.

13. Apparatus for establishing the magnetic bias field strength within a optimum range of the permanent magnet structure for a shielded magnetic bubble domain module having a pair of elongated slots extending through the module on opposite sides thereof, said apparatus comprising:

magnetic field generating means operably associated with said magnetic bubble domain module but separate therefrom and including conducting members adapted to be temporarily moveably inserted within the magnetic bubble domain module through the slots therein and oriented with respect thereto to vary the magnetic bias field of the magnetic bubble domain module;

current source means electrically connected to said magnetic field generating means for selectively providing a constant electrical current at any one of a plurality of magnitudes of constant currents to the conducting members of said magnetic field generating means;

support means for supporting the magnetic bubble domain module during the testing thereof;

contact means operably associated with said support means and adapted to contact the signal leads of the magnetic bubble domain module for supplying electrical signals to and receiving electrical signals from the signal leads, said contact means comprising a printed circuit board, one side of which is engageable with said support means, a plurality of conducting tabs extending from said one side of said printed circuit board, a plurality of narrow-line conductors disposed substantially parallel along the surface of said one side of said printed circuit board and contacting said plurality of conducting tabs, and an edge connector located along one edge of said one side of said printed circuit board and contacting said plurality of narrow-line conductors;

said magnetic field generating means providing a magnetic bias field within the magnetic bubble domain module at a selected field strength in response to energization of said conducting members thereof by a constant electrical current of a selected magnitude from said current source means; and analyzer means operably associated with said magnetic bubble domain module and electrically connected to said narrow-line conductors on said printed circuit board by said edge connector for testing said magnetic bubble domain module via evaluation and analyzation of said module during the establishment of an optimum magnetic bias field strength for the permanent magnet structure.

14. Apparatus as set forth in claim 13, wherein said contact means further includes:

first and second bifurcated prong members extending from said one side of said printed circuit board, said first and second bifurcated prong members respectively electrically contacting said conducting members of said magnetic field generating means; and a transverse elongated conductor electrically connecting said first and second bifurcated prong members.

15. A process as set forth in claim 6, further including producing an analysis printout indicating the non-functioning areas of said magnetic bubble domain module relative to the optimal bias field strength in response to signal outputs received from said magnetic bubble domain module for each of the constant electrical current magnitudes provided to said magnetic field generating means.

* * * * *